US006784678B2

(12) United States Patent
Pietzschmann

(10) Patent No.: US 6,784,678 B2
(45) Date of Patent: Aug. 31, 2004

(54) TEST APPARATUS FOR SEMICONDUCTOR CIRCUIT AND METHOD OF TESTING SEMICONDUCTOR CIRCUITS

(75) Inventor: Frank Pietzschmann, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/923,720

(22) Filed: Aug. 6, 2001

(65) Prior Publication Data

US 2002/0024354 A1 Feb. 28, 2002

(30) Foreign Application Priority Data

Aug. 4, 2000 (DE) .......................................... 100 39 336

(51) Int. Cl.[7] .............................................. G01R 31/02
(52) U.S. Cl. ...................... 324/758; 324/757; 324/754
(58) Field of Search ................................ 324/753, 754, 324/758, 763, 765, 762, 158.1

(56) References Cited

U.S. PATENT DOCUMENTS

| | | | | | |
|---|---|---|---|---|---|
| 5,172,053 A | * | 12/1992 | Itoyama | ...................... | 324/758 |
| 5,399,983 A | * | 3/1995 | Nagasawa | ................... | 324/758 |
| 5,525,912 A | * | 6/1996 | Momohara | .................. | 324/754 |
| 5,804,983 A | | 9/1998 | Nakajima et al. | ........... | 324/758 |
| 5,825,192 A | * | 10/1998 | Hagihara | .................... | 324/757 |
| 5,982,182 A | * | 11/1999 | Chiu et al. | ................... | 324/754 |
| 6,137,296 A | * | 10/2000 | Yoon et al. | .................. | 324/754 |
| 6,166,552 A | * | 12/2000 | O'Connell | .................... | 324/754 |
| 6,297,656 B1 | * | 10/2001 | Kobayashi et al. | ......... | 324/758 |
| 6,441,629 B1 | * | 8/2002 | Khoury et al. | .............. | 324/757 |

FOREIGN PATENT DOCUMENTS

DE            198 53 445 A1      5/2000

* cited by examiner

*Primary Examiner*—Kamand Cuneo
*Assistant Examiner*—Paresh Patel
(74) *Attorney, Agent, or Firm*—Laurence A. Greenberg; Werner H. Stemer; Ralph E. Locher

(57) ABSTRACT

A wafer test apparatus for bringing the contact areas of the integrated circuits to be tested into electrical connection with the test contacts as uniformly as possible and therefore with relatively low necessary contact pressures. The test apparatus has a chuck for holding a wafer having at least one integrated circuit with a group of contact areas which define a wafer surface profile. A test head is configured opposite the chuck and has a performance board, on which a probe card with contacts for making contact with the contact areas of the integrated circuit is configured. Areas of the contacts, of the probe card, which are intended to come into contact with the contact areas define a test surface profile. Actuators are configured on the probe card for aligning the test surface profile in parallel with the wafer surface profile and for changing the distance between the performance board and the contacts in a direction substantially orthogonal to the wafer surface profile.

26 Claims, 7 Drawing Sheets

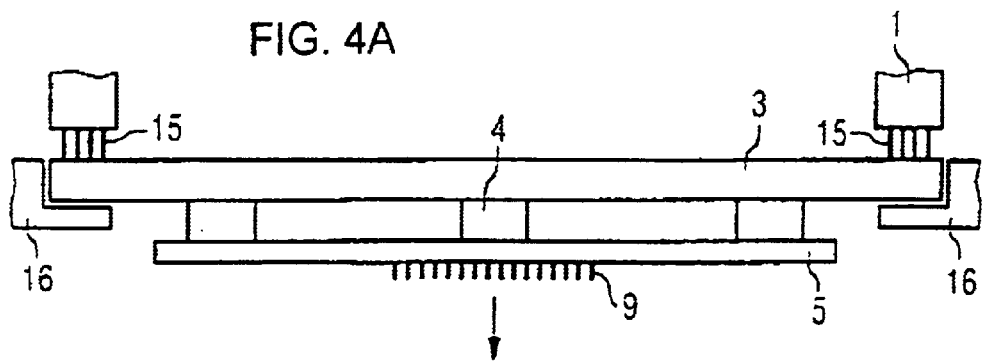
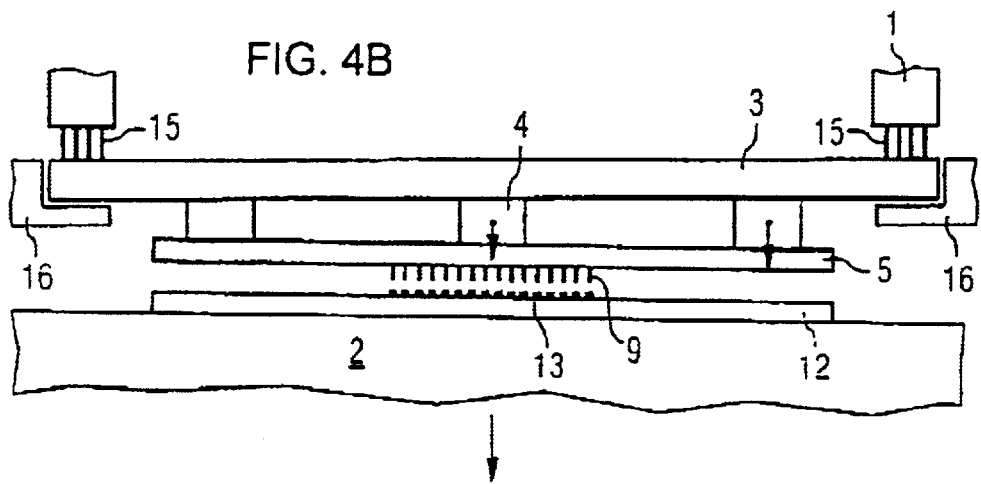
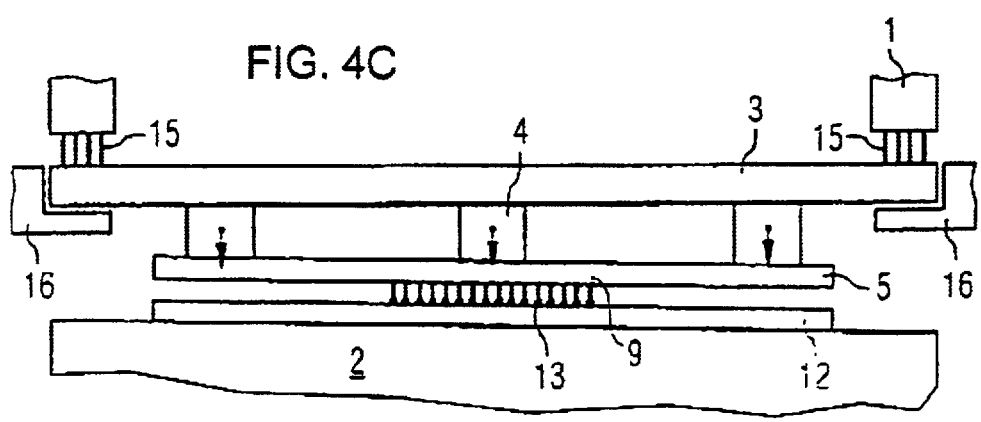

TEST APPARATUS FOR SEMICONDUCTOR CIRCUIT AND METHOD OF TESTING SEMICONDUCTOR CIRCUITS

BACKGROUND OF THE INVENTION

Field of the Invention

The present invention relates to a test apparatus for semiconductor circuits, in which the test apparatus has a specifically designed probe card that can be used to compensate for differences in height and planarity of test points in relation to contact surfaces of wafers. The probe card enables a subsequent feed movement of the test points in order to make simultaneous electrical contact with all of the contact surfaces.

After integrated circuits are fabricated, they are subjected to a first step of a functional test while they are still integrated in the wafer, that is to say before they are separated. This is done using a test apparatus that includes a wafer holder, known as a chuck, to hold a wafer, and also includes a test head. By being raised or lowered (Z position), the chuck can be moved towards the probe card that is configured above the chuck, and in addition, can be moved in the X and Y directions in order to be able to bring the contact surfaces of the various circuits that are located on the wafer into connection with the corresponding contact pins on the probe card. The test head usually includes test electronics for transmitting test signals and for evaluating the output signals coming from the individual integrated circuits on the wafer. The probe card carries the contacts and is connected to the test head via a holding mechanism. The probe card is usually a multilayer printed circuit board, known as the "performance board", which is usually universal or has been designed specifically for the circuit to be tested. The probe card first, produces a connection with the tester electronics and second, via the contact pins, produces a connection to the wafer to be tested. It is usual for new printed circuit boards to be developed for each product to be tested, in order to take account of the respectively different association between a tester channel and the contact pins.

In order to carry out the actual test, the wafer that is located on the chuck is aligned, by means of electronically controlled stepping motors and image recognition technology, in such a way that the tips of the contact pins arrive as closely as possible to the center of the associated wafer contact area. The chuck is then moved upward with a predefined speed/travel profile, so that the springy tips of the contact pins finally produce electrical contact with the wafer contact areas (pads) with a defined contact pressure.

In the probe card technologies used hitherto, planarity differences in the probe card attitude, the wafer holder (chuck) and the wafer itself, caused by the devices, are compensated for by an appropriately springy construction of the contacts. The contact pins are normally produced from tungsten wire, are inserted manually into the probe card after appropriate shaping by bending, and are fixed with an epoxy resin. These contact pins have a certain flexibility, so that they are able to compensate for unevenness in the aforementioned components by mechanically springing with a corresponding overpressure. This leads to planarity differences manifesting themselves directly in different contact forces and scrub lengths and depths, as they are known, that is to say in the length and depth of the furrows scratched into the surface of the wafer contact areas by the contact pins.

This method, known from the prior art, hampers further miniaturization of the chip contact areas and the contact area layer thicknesses, since they can also lead to cracking—down as far as layers located under the contact areas. This becomes increasingly significant in the case of large-area contact configurations, for example, the simultaneous contact-making with up to 64 integrated circuits. Even slight angular displacements in this case produce large planarity differences.

A further example of contacts known from the prior art is the T2 probe card technology from the Formfactor company. This makes use of contact sets which are produced lithographically and are applied to a multilayer ceramic. The multilayer ceramic is used to supply the electrical contact between a performance board and the contacts. Because of the relatively high temperatures occurring during the sintering process, the connections are produced from tungsten, which entails the disadvantage of an increased contact resistance of about 5 ohms. Both the contacts and the ceramic substrate are spring-mounted, in order to compensate for planarity differences and to implement the movement of the contacts necessary to pierce the contact area oxide.

In order to compensate for the problems of the different levels of contact forces of the contacts, U.S. Pat. No. 5,803,983, for example, proposes a holding mechanism for the probe card, which can be tilted. While a pivot of the holding mechanism, which is circular in plan view, constitutes a tilting joint, two further points are provided at which the holding mechanism can be moved upward or downward with respect to the rest of the apparatus. The result of this is a tilting mechanism for the probe card. As a rule, the setting of the level of tilting is set once for an entire series of circuits on wafers to be tested with a probe card.

However, the mechanism proposed in U.S. Pat. No. 5,804,983 only permits tilting of the entire plane of the probe card in order to compensate for corresponding systemic tilting of the probe card, the probe card holder and the chuck, and systematic skewing of the wafers to be tested. The planarity differences within the probe card remain unconsidered in this case. In addition, in the mechanism proposed there, the action of making contact with the contact areas of the wafer, using the contacts of the probe card, is carried out by moving the chuck toward the probe card until the electrical connection is produced. The forces arising as a result of this coarse mechanism can still have the unwanted and disadvantageous secondary effects described above. In addition, compensating for unevenness on the wafers to be tested is not possible using the mechanism proposed there.

SUMMARY OF THE INVENTION

It is accordingly an object of the invention to provide a test apparatus and a method of using the test apparatus which overcomes the above-mentioned disadvantageous of the prior art apparatus and methods of this general type. In particular, it is an object of the invention to provide a test apparatus with which it is possible to bring the contact areas of the integrated circuits to be tested into electrical contact with the test contacts as uniformly as possible, and therefore with relatively low requisite contact pressures.

With the foregoing and other objects in view there is provided, in accordance with the invention, a test apparatus for testing at least one semiconductor integrated circuit having a group of contact areas defining a wafer surface profile. The test apparatus includes a chuck for holding a wafer that has at least one semiconductor integrated circuit with a group of contact areas that define a wafer surface profile. The test apparatus also includes a test head that is configured opposite the chuck and that includes a performance board. The test apparatus also includes a probe card that is configured on the test head and that has contacts for making contact with the contact areas of the integrated circuit. The contacts have areas that are intended to come into contact with the contact areas of the integrated circuit and that define a test surface profile. The test apparatus also includes actuators that are configured on the probe card for aligning the test surface profile parallel with the wafer surface profile. The actuators are also for changing a distance between the performance board and the contacts in a direction substantially orthogonal to the wafer surface profile.

The invention relates to a test apparatus that has combined compensation for tilting and planarity and also a contact-making advance mechanism.

The invention also relates to an apparatus that, on the basis of low contact pressures and slight lateral contacting movements associated with this, permits contact to be made even with small wafer contact areas.

The invention additionally relates to a test apparatus in which the actual contact-making movement is produced by micro movements of the contact pin array or individual pins.

The invention further relates to a test apparatus in which, by means of improved guidance of the contacts in relation to the contact areas of a wafer to be tested, the use of photolithographically produced contacts is possible.

The invention also further relates to a test apparatus in which, as a result of the improved three-dimensional guidance of the contacts, the use of a wafer as a probe card has become possible.

A critical feature for the possible reduction in the contact pressure is that all of the tips of the contacts are at the same distance from the contact areas on the wafer with which they are to make electrical contact. This avoids different distances between contacts and contact areas that have to be compensated for by excessive contact pressures. This is achieved by duplicating the wafer surface profile by a test surface profile using actuators integrated in the probe card.

In this case, the wafer surface profile is to be understood to mean the three-dimensional configuration of the wafer surface in the region of the contact areas with which contact is to be made, and their alignment in space. Differences in the height of the wafer surface profile may possibly occur because of differences in the relative heights of the individual contact areas on the wafer to be tested and also because of tilting of the overall wafer, be this caused by the wafer itself or by the wafer holder.

In a corresponding way, the test surface profile is to be understood to be the three-dimensional surface profile which reflects the three-dimensional configuration of those points on the contacts which are intended to come into contact with the contact areas, normally, therefore, the tips of the contacts.

According to the invention, the wafer surface profile and the test surface profile should be parallel to each other. In the sense of the present invention, this is to be understood to mean that the test surface profile, within the context of the matching that is possible in a practical embodiment, has as few differences as possible with respect to the distances between the contacts and the contact areas with which they are to make contact. In simple embodiments of the present invention, in which all of the contacts are configured immovably on one plane, this can mean that this plane is parallel to an average plane that can be determined from the wafer surface profile. In the case of complex embodiments, it can mean that the distance of each contact from the associated contact area (that is to say the contact area with which it is to make connection) is identical. The range of possible adaptations of the surface profile therefore reaches from simple tilting as far as "nestling" the contact pins up to the wafer surface profile.

The necessary adaptation is carried out by means of actuators which are configured on the probe card and which can move the contacts. At the same time, the actuators perform a further task, namely, bringing the contacts into electrical connection with the contact areas using a micro movement. It is precisely in the combination of these two functions in the actuators that a particular advantage of the present invention resides, making it possible to press the contacts finely and with reduced force onto the contact areas located on the wafer.

In the sense of the present invention, the term "substantially orthogonal" to the wafer surface profile is to be understood to mean that all of the contacts are moved simultaneously onto the wafer to be tested. Depending on the actual configuration of the invention, this movement can take place actually precisely orthogonally with respect to the wafer surface profile or orthogonally to the longitudinal axis of test head and chuck, which corresponds to a mechanism that is simpler to implement.

For the purpose of practical implementation, numerous embodiments are available. For example, the actuators can be configured between the performance board and the probe card and can be connected to these. Simultaneously connecting the actuators to the performance board and to the probe card makes it possible, by lengthening or shortening the actuators, to change the distance between the whole probe card, and therefore the contacts located on it, and the performance board. As a result of this configuration, tilting movements of the entire probe card, and therefore compensation for tilting of the chuck or the wafer, are possible.

Particular preference is given to configuring at least three actuators between the performance board and the probe card and connecting the actuators to these components. Three actuators ensure the necessary stability and permit the assumption of any desired positions of the probe card within the context of the possible lengthening or shortening of the actuators.

It is also possible for a plurality of actuators to be configured between the performance board and the probe card and to be connected to these components. The probe card consists of a material which is capable of following the movements of the actuators flexibly. This already permits considerably better adaptation of the test surface profile to the wafer surface profile, since unevenness or height fluctuations on the wafer which are not caused by a simple tilting of the wafer can be taken into account. The principle resembles that of large telescopes of modern design, in which the mirrors can be bent by actuators configured under the mirrors in such a way to compensate for temperature-induced differences in the incident wave front. The accuracy of this adaptation mechanism depends on the number of actuators and on the flexibility of the probe card used.

A further possible way of positioning the actuators consists of arranging them in the probe card itself and connecting them to the contacts and to a substrate of the probe card. This embodiment makes it possible to provide a dedicated actuator for each contact on the probe card. The actuator is capable of moving the contact out of the probe card or moving it into the latter. This embodiment permits the greatest flexibility in the adaptation, but because of the relatively reduced space within the probe card, is restricted to smaller compensatory movements than is possible in the case of relatively large actuators which are configured between the probe card and the performance board.

A further possible embodiment is for the probe card to include a number of partial cards which are separated from one another and which each have dedicated actuators for adaptation to a number of groups of contacts on the wafer to be tested. This makes it possible, in a simple and flexible way, to test a number of integrated circuits simultaneously on one wafer, by providing partial cards belonging to the probe card in which each can be adapted locally to the conditions of the individual circuits to be tested. The smaller the overall area over which the contact areas to be tested are distributed, the more simply it is possible to compensate for tilting, and the lower will be the height differences between the individual contact areas.

A combination of the various techniques proposed is also possible, for example, relatively large actuators can compensate for global tilting of the wafer or the wafer holder, and at the same time, small actuators can be provided at each contact, which compensate for individual height differences and which permit the contacts to be pushed forward toward the wafer until the electrical connections are actually produced.

In order to implement the actuators, various technologies are available. One particularly preferred embodiment of actuators is piezoelectric elements. These can easily be driven electrically to change their length as a function of the voltage applied, and can therefore be used particularly beneficially in the case of restricted spatial conditions. Piezoelectric elements can be produced by lithography so that the obvious thing, when integrating the actuators into the actual probe card, is to produce the entire probe card, possibly including the contacts used, by a lithographic method.

Furthermore, the actuators can be hydraulic or electromechanical elements, whose functioning and implementation are familiar to those skilled in the art, as are those of piezoelectric elements. Possible actuators can be based on magnetoresistive, electromagnetic or electroresistive principles. They can be linear or rotating micro-motors with gear mechanisms or pneumatic or hydraulic pumps or valves.

In order to permit fast coarse positioning (coarse feeding) of the wafer into the vicinity of the test head, provision can also be made for the chuck to have a chuck drive which can move the chuck in the direction of the test head.

As already mentioned above, hitherto, probe cards were previously designed, with a specific contact surface layout of wiring for each integrated circuit to be tested. Prior art probe cards normally used intrinsically also carried all of the conductor tracks, in addition to the contact pins, in order to be capable of implementing predefined electrical allocation of a respective tester channel to a contact pin. This complicated conductor track layout, which normally has to be implemented using multilayer or multi-wire technology, increases the cost of the probe cards to a considerable extent.

In order to provide a simplification here, for the present invention, it is preferred for the performance board to be a circuit board which has one group of contacts in a predefined configuration for making contact with a tester and evaluation and control electronics. The performance board also has a second group of contacts in a second predefined configuration for making contact with contacts on the probe card. This preferred embodiment enables the performance board to be used as a universal adapter, which makes it possible to provide all of the probe cards with identical contacting means.

In a corresponding way, the probe cards have contacts for making contact with the second group of contacts on the performance board. This embodiment of the invention is particularly useful when the probe card used is a wafer since, here, the requisite conductor tracks can be implemented in a simple way within the wafer. The construction of a complicated multilayer circuit board or a comparable conductor track structure therefore remains restricted to the one-off construction of an appropriate performance board. Nevertheless, the use of such an adapter ensures that conventional test apparatus can be used.

In order to be able to determine the actual distance of the contacts from the contact areas, distance sensors are preferably used. These can be configured, for example, on the same side of the probe board on which the contacts are located. The distance sensors determine a distance from the wafer to be tested in an optical or an electrical manner. The more exactly the test surface profile is to be matched to the wafer surface profile, or can be matched on the basis of the relatively large number of actuators, the greater is the number of distance sensors needed for the exact assessment of the existing distance.

The distance sensors may be optical sensors, pressure sensors connected to the contacts, capacitive sensors or other sensors suitable for determining the distance of the contacts from the wafer.

It is also possible to accommodate additional functions on the probe card. For example, it is preferable for the probe card to have means for storing and outputting an identification number. This makes it possible for a probe card being used to be recognized automatically by the test electronics and for an appropriately adapted test program to be started, since the type of integrated semiconductor to be tested is given by the identification number.

Furthermore, it is preferred for the probe card to have test circuits for the coordinated application of test signals and/or test signal sequences to the wafer to be tested. In this way, part of the functionality of the test electronics is moved into the probe card itself.

It is also possible to provide, in the probe card, control means for the evaluation of signals which are output by the distance sensors and which drive the actuators. In this way, the probe card can become an autonomous unit, which no longer requires any kind of external control. The adaptation of the alignment of the contacts to the wafer to be tested is then carried out without any intervention by an external control unit.

Further additional functions are possible, for example a touch down counter, an operating hours counter, a pressure overload monitor, and also further integrated components such as capacitors and switches.

Not exclusively but particularly beneficially, these additional functionalities may also be implemented if the probe card is a wafer or contains a wafer or is a part of a wafer. In such a case, it is additionally preferred for the contacts to be a constituent part of the wafer. In this way, the contacts may be produced in a lithographic process, which reduces the costs of production and avoids the manual alignment of contact pins, which is subject to error and is arduous.

The actuators can also be placed on a wafer, which can be configured between the probe card and the performance board and which is connected to the probe card. This second wafer, also referred to as a planarizer, is therefore connected to the actual probe card to form a sandwich configuration.

With the foregoing and other objects in view there is provided, in accordance with the invention. A method of testing semiconductor circuits in a test apparatus, which includes the following steps: providing a wafer that has at least one semiconductor integrated circuit with a group of contact areas that define a wafer surface profile; providing a test apparatus that includes a chuck for holding the wafer; providing the test apparatus with a test head that is configured opposite the chuck and that includes a performance board; providing the test apparatus with a probe card that is configured on the test head and that has contacts for making contact with the contact areas of the integrated circuit; providing the contacts with areas that are intended to come into contact with the contact areas of the integrated circuit and that define a test surface profile; providing the probe card with actuators; using the actuators to align the test surface profile parallel with the wafer surface profile; and using the actuators to enlarge a distance between the performance board and the contacts in a direction substantially orthogonal to the wafer surface profile until the contacts of the probe card have produced an electrical connection with the contact areas of the wafer.

All that has been stated and explained with respect to the test apparatus will apply in a similar way to the method, so that the entire content of that which was stated above is included, and reference is made thereto with regard to the method.

It is preferable if the distance between the performance board and the contacts is increased until the contacts have removed a surface of the contact area and/or penetrated it. Depending on the practical implementation of the design of the contacts, the latter can produce a scratching movement on the surface in order to remove an oxide layer or another layer that may be present or to force this to the side, that is to say to penetrate it.

In order to ensure that the wafer is moved rapidly into the area of the contacts, the chuck, and therefore the wafer to be tested, can be moved toward the probe card up to a pre-defined distance between wafer and probe card. This pre-defined distance can be determined by a corresponding measuring instrument on the chuck, or by the distance sensors configured on the probe card.

The method can include a step of permanently registering the distance between the probe card and the wafer to be tested. Registering the distance can ensure that the adaptations of the test surface profile to the wafer surface profile can be carried out in an optimum way.

The alignment action can be a simple tilting of the probe card in relation to the wafer to be tested. In this case, the adaptation of the surface profiles therefore consists merely in bringing an imaginary plane of the contact tips, parallel to an averaged and likewise imaginary wafer surface profile.

The alignment action can, moreover, be carried out by bending the probe card to form the necessary surface profile. The alignment can further set the distance between the contacts and the contact areas with which they are to make contact to a common distance or in other words to the same distance. In a preferred embodiment, the same distance can be set by providing an actuator for each contact and by changing the position of the individual contacts using the actuator for each contact.

Increasing the distance between the performance board and the probe card in turn is preferably carried out by uniformly extending all of the actuators to a length which is greater than the length assumed for the alignment action. Depending on the measuring technique used in the distance sensors, the number of actuators and the basic principle of the test apparatus used, it is possible to carry out the steps of aligning and increasing the distance and making contact in one step. In this way, for example, if there is one actuator for each contact, after a certain distance has been covered, which can be carried out for example by moving up the chuck, it is simply possible to lower all of the contacts onto the surface by means of the existing actuators until an electrical connection has been made. The actuators are then stopped and remain in their corresponding position.

Furthermore, at least during the enlargement of the distance between the performance board and the contacts, the contacts can be set vibrating and/or oscillating. In this way, the penetration into the contact area and the removal of an oxide layer on the contact area can be improved, which leads to an improved electrical signal during the test.

Other features which are considered as characteristic for the invention are set forth in the appended claims.

Although the invention is illustrated and described herein as embodied in a test apparatus for semiconductor circuit and method of testing semiconductor circuits, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 4A–4C illustrate a method of testing semiconductor circuits;

DESCRIPTION OF THE PREFERRED EMBODIMENTS

Figure 1:
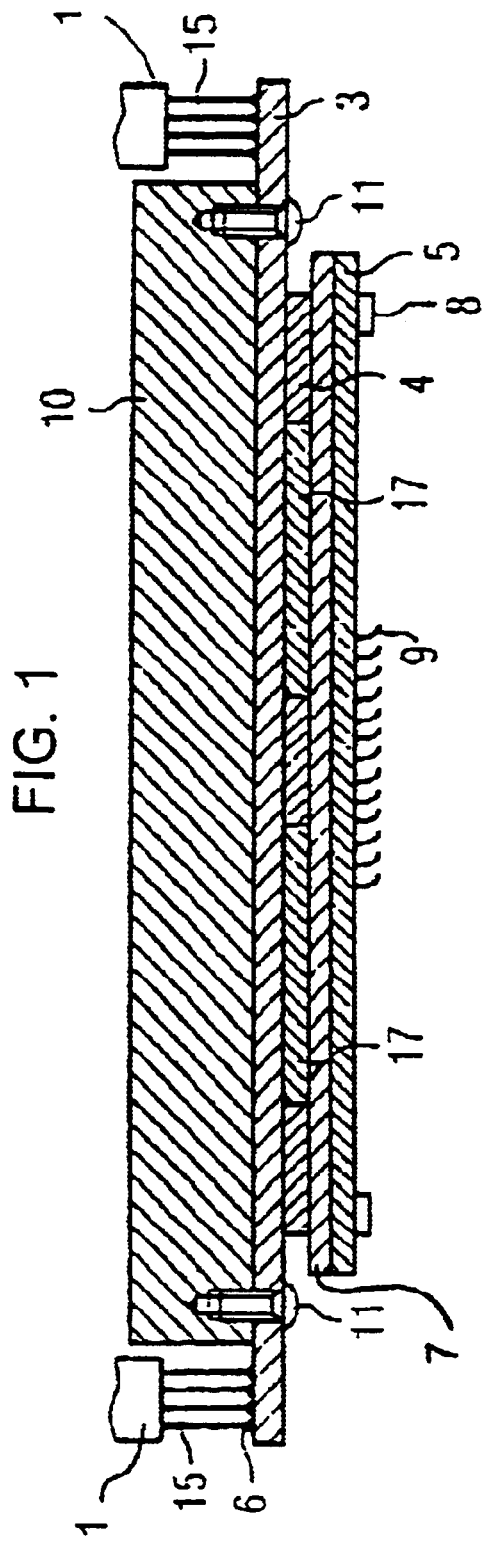
FIG. 1 shows a test-head area with a performance board and a probe card.

Referring now to the figures of the drawing in detail and first, particularly, to FIG. 1 thereof, there is shown a mechanism having a performance board 3 and a probe card 5. Inserted in between the probe card 5 and the performance board 3 is a planarizer 7, on which the actuators 4 are configured. The planarizer 7 is supported on the performance board 3. An interconnector 17 produces the vertical, electrical connection between probe card 5 and performance board 3. If required, a card stiffening element 10 can also be fitted to the top of the performance board 3 and connected to the latter, for example by screws 11. Distance sensors 8 and contacts 9, shown as contact pins having a bent-over tip region, are also located on the probe card 5. The performance board 3 is connected electrically to the test head 1 (only partially illustrated) via pin contacts (pogo pins) 15 and gold pads 6.

Figure 2:
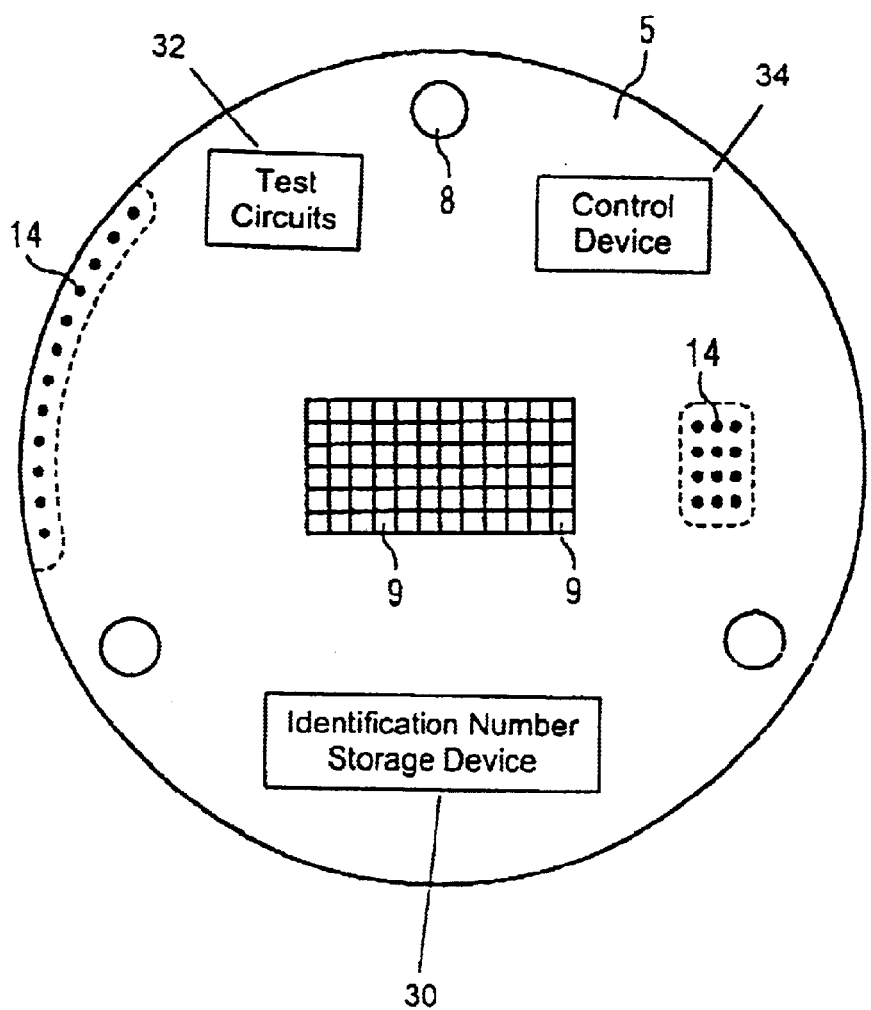
FIG. 2 shows a bottom view of the probe card shown in FIG. 1.

FIG. 2 is a bottom view of the probe card 5 shown in FIG. 1 and shows three distance sensors 8 and also a configuration of contacts 9. Contacts 14 are located on the rear of this probe card 5 for making connection with the performance board 3. These contacts 14 cannot be seen in the normal case in this bottom view, since they are located on the rear of the probe card 5. They are therefore drawn in a dotted outline illustrated in FIG. 2. It is preferable for the probe card 5 to have a device 30 for storing and outputting an identification number. This makes it possible for the probe card 5 to be recognized automatically by the test electronics and for an appropriately adapted test program to be started, since the type of the integrated semiconductor to be tested will be given by the identification number. Furthermore, it is preferred for the probe card 5 to have test circuits 32 for applying coordinated test signals and/or test signal sequences to the wafer 12 to be tested. In this way, part of the functionality of the test electronics is moved into the probe card 5 itself. The probe card 5 can also include a control device 34 for evaluating the signals that are output by the distance sensors 8 and for driving the actuators 4. In this way, the probe card 5 can become an autonomous unit, which no longer requires any kind of external control.

Figure 3:
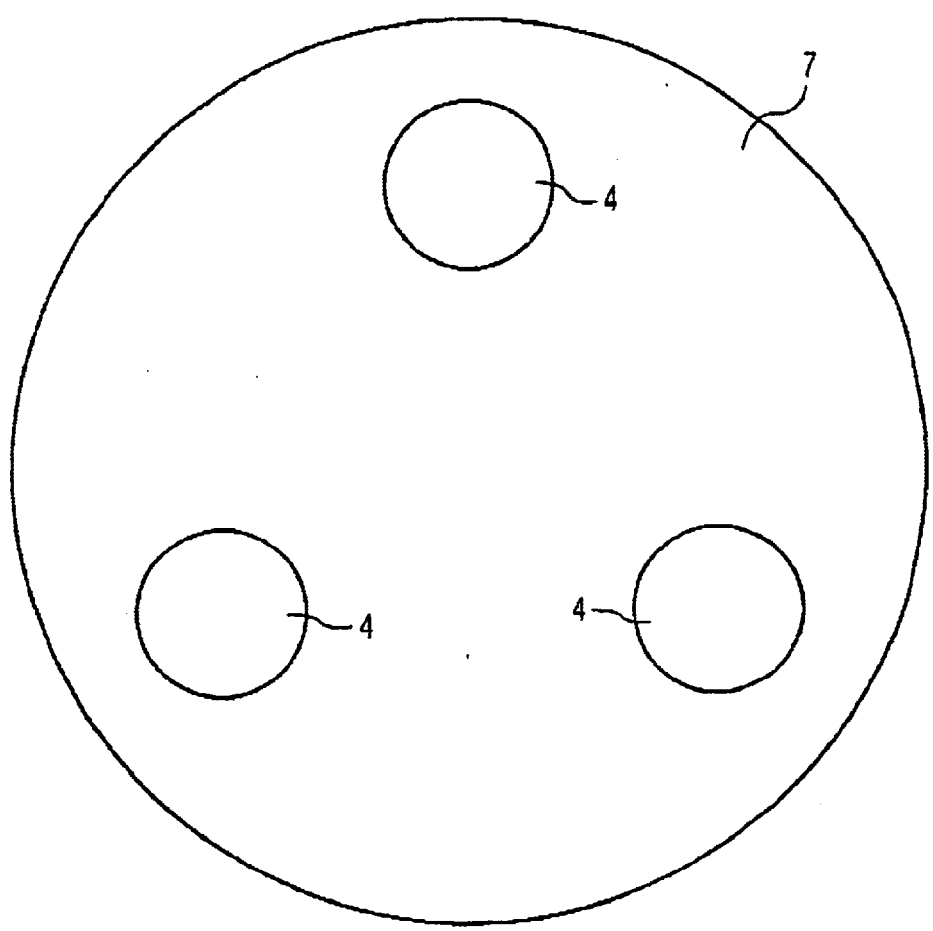
FIG. 3 shows a plan view of a planarizer that shown in FIG. 1.

FIG. 3 shows a planarizer 7 that, for example, can be designed as a second wafer and that has the actuators 4 configured thereon. The second wafer can, for example, be a semiconductor wafer produced lithographically that has piezoelectric actuators with voltage-dependent length movements. These movements can be controlled in conjunction with the distance sensors 8 mentioned above to produce an adaptation of the planarity to that of the wafer to be tested.

By using semiconductor wafers both for producing the probe card 5 and for producing the planarizer 7, various types of probe cards 5 and planarizers 7 can be produced in a simple way. The planarizer 7 shown in FIG. 3 must likewise have contacts and forwarding lines that can make connection with the contacts 14 on the probe card 5. One possible concept for producing this vertical electrical connection between wafers is referred to as stacked wafer length packaging (S-WLP) and is described by TRU-SI Technologies Inc.

FIG. 4A illustrates the inventive method using a simplified embodiment of the test apparatus. The test head 1 has been lowered onto the performance board 3 and has been inserted into the performance board support 16, and contacts 15 produce electrical connection with the tester electronics. Actuators 4 connected to the performance board 3 move the probe card 5 downward.

FIG. 4B shows the initial state of the test apparatus. In this embodiment of the test apparatus, a wafer 12 having contact areas 13 is positioned on a chuck 2 and after the chuck 2 has been extended, the probe card 5 is tilted by the piezoelectric or other actuators 4 until the probe card 5 is parallel to the wafer 12. Here, the arrows in the actuators 4 are intended to indicate the different extents of the movement.

As FIG. 4C shows, in a further step the entire probe card 5 is then lowered onto the wafer 12, until the contacts 9 make electrical connection with the contact areas 13 of the wafer 12. In this embodiment, the probe card 5 is lowered vertically downward as shown in FIG. 4C. Depending on the actuators 4 used and on their configuration, however, it is also possible to carry out a movement that leads directly in the direction of the surface of the wafer 12.

Figure 5:
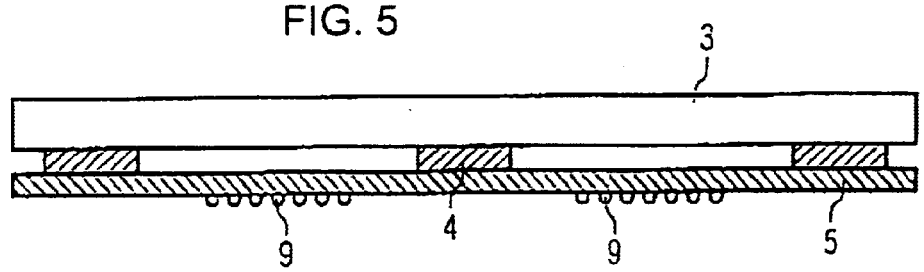
FIG. 5 shows a further embodiment of a probe card with contact projections.

A further embodiment of the test apparatus is shown in FIG. 5. In this case, the contacts 9 are spherical and are not pins. In addition, in this embodiment the performance board 3 and probe card 5 are connected directly to each other via the actuators 4.

Figure 6:
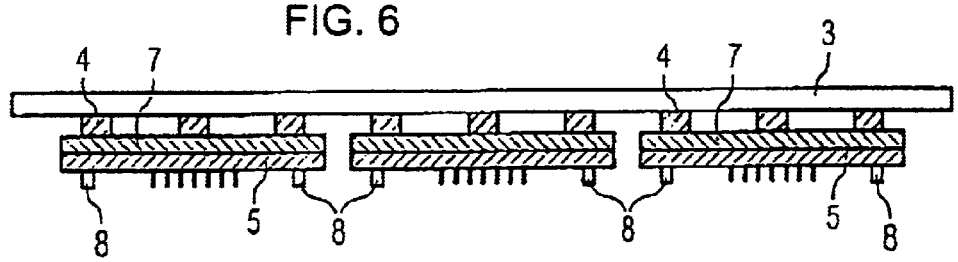
FIG. 6 shows a probe card having a number of partial cards.

FIG. 6 shows a further preferred embodiment of the invention, in which the probe card 12 is formed by a plurality of partial cards. Each of the partial cards is equipped with distance sensors 8 and with one group of contacts 9, which permit contact to be made simultaneously with a number of integrated circuits to be tested that are configured on a wafer 12.

Figure 7:
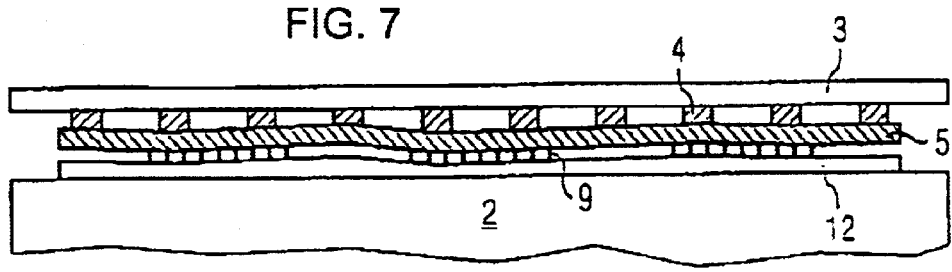
FIG. 7 shows a flexible probe card with actuators that have been actuated.

A flexibly configured probe card is shown in FIG. 7. Because of the large number of actuators 4 used, the test surface profile of the probe card 7 can be adapted particularly well to the surface profile of the wafer 12.

Figure 8:
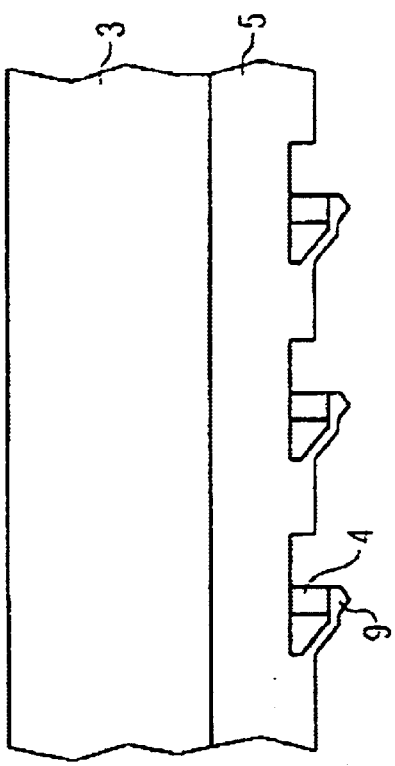
FIG. 8 shows a probe card in which each contact is driven individually by an actuator.

A further increase in this adaptation ability can be achieved by the embodiment shown in FIG. 8. Here, each of the contacts 9 belonging to the probe card 5 has its own actuator 4 which, in the present case, is configured in a trench located under the contact 9. The actuators 4 can change their length individually and therefore can adjust how far each one of the contacts 9 is moved out of the surface of the probe card 9. A respective integrated pressure sensor can ensure that a uniform contact pressure is obtained between the contacts 9 of the probe card 5 and the contact areas 13 of the wafer 12 by using a control loop.

Figure 9:
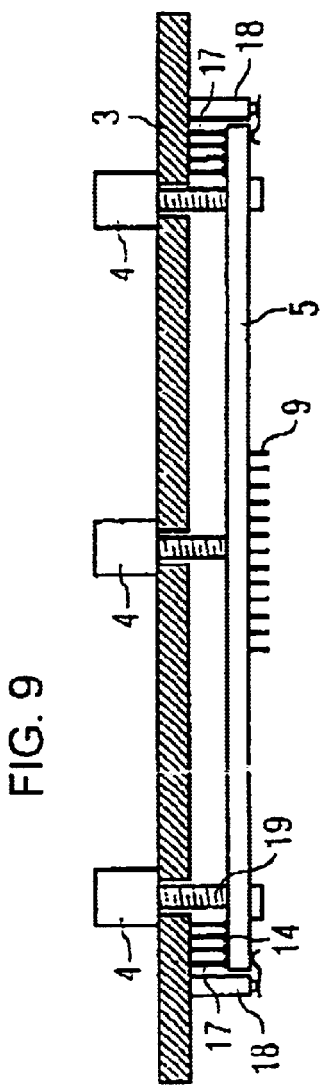
FIG. 9 shows a further embodiment of a test apparatus, in which the probe card is planarized or moved by external actuators.

FIG. 9 shows another embodiment of the inventive solution in which conventional probe cards are retrofitted with external piezoelectric drives and a corresponding multivariable circuit is provided. Setting plungers 19 are used instead of conventionally used setting screws. These setting plungers 19 are set by drives 4 that are configured above the setting screw openings. The conventionally constructed probe card 5 can now be adapted to each wafer by means of its movement. The probe card 5 is fixed to probe card holders 18 by means of springs and the like. The probe card 5 is connected to the performance board 3 by contact 14 and interconnector pins 17.

The present invention eliminates the disadvantages known from the prior art by means of adaptive vertical feeding. The chuck of the tester (test apparatus) continues to be used only for the coarse vertical feeding of the wafer with which contact is to be made. During a one-off setup phase, the chuck is moved upward until, for example, the first of a row of distance sensors belonging to the probe card, signals the desired position. During continuous testing operation, a planarization phase, in which all of the piezoelectric actuators expand until the distance sensors output desired positions, is then carried out during each "touch-down" on an integrated circuit. Following is the uniform feeding of all three actuators, the precision vertical feeding, as it is called. If appropriate, in order to improve contact making, this can also be combined with an oscillatory movement or vibration. Using conventional wafers and a practical embodiment of the present invention, the travel of the planarizer, for example, in the case of three actuators and a normal probe card size, which is necessitated by the wafer size used, may have a travel of at most 50 $\mu$m on one side. The precision vertical feeding, that is to say the operation of increasing the distance between performance board 3 and probe card 5, is, for example, of the order of magnitude of at most 5 $\mu$m. The penetration depth of the contacts 9, for example contact pins, into the contact areas 13 to be tested of the integrated circuit is, for example, at most 200 nm.

Of course, it is likewise possible to achieve kinematic reversal of the principle used, by the precision vertical feeding, and if appropriate, also the tilting compensation being carried out by an apparatus which is configured under the wafer and not in the test head.

The form of the contacts 9 on the probe card 5 can be chosen freely, depending on the intended purpose. For example, it is possible to use pins with bent tips, as well as hemispherical contacts or contacts like chisels or needle points. Particular preference is given to those contact forms which can be produced photolithographically, if a wafer is used as the probe card.

Figure 10:
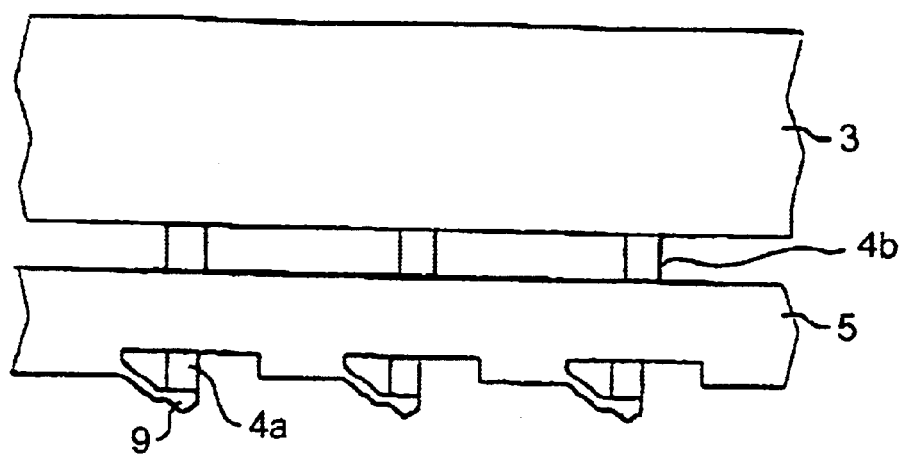
FIG. 10 shows a combination of a performance board with global actuators and a probe card with dedicated actuators.

A combination of the various techniques proposed is also possible. For example in FIG. 10, relatively large global actuators 4b can compensate for global tilting of the wafer or the wafer holder, and at the same time, small dedicated actuators 4a can be provided at each contact 9, which compensate for individual height differences and which permit the contacts 9 to be pushed forward toward the wafer until the electrical connections are actually produced.

The present invention has solved an old problem of making contact with integrated circuits to be tested. Better adaptation of the surface profiles to each other means that the necessary contact pressure of the contacts has been reduced decisively.

I claim:

1. A test apparatus for testing at least one semiconductor integrated circuit having a group of contact areas defining a wafer surface profile, the test apparatus comprising:

a chuck for holding a wafer that has at least one semiconductor integrated circuit with a group of contact areas that define a wafer surface profile;

a test head that is configured opposite said chuck and that includes a performance board;

a probe card that is configured on said test head and that has contacts for making contact with the contact areas of the integrated circuit, said contacts having areas that are intended to come into contact with the contact areas of the integrated circuit and that define a test surface profile; and at least three actuators electrically driven to change actuator length according to an electrical signal from sensors, said at least three actuators being configured on said probe card for aligning the test surface profile parallel with the wafer surface profile prior to the test surface profile contacting the wafer surface profile, said actuators also changing a distance between said performance board and said contacts of said probe card in a direction substantially orthogonal to the wafer surface profile.

2. The test apparatus according to claim 1, wherein said actuators are configured between said performance board and said probe card and are connected to said performance board and said probe card.

3. The test apparatus according to claim 2, wherein said probe card is made from a material that is capable of flexibly following movements of said actuators.

4. The test apparatus according to claim 1, wherein:
said probe card includes a substrate; and
said actuators are configured in said probe card and are connected to said contacts of said probe card and to said substrate.

5. The test apparatus according to claim 1, wherein:
the wafer has a plurality of groups of contact areas; and
said probe card includes a plurality of partial cards that are separated from each other and that each include ones of said actuators to adapt to a number of the plurality of the groups of the contacts on the wafer.

6. The test apparatus according to claim 1, wherein said actuators are selected from the group consisting of piezoelectric elements, hydraulic elements, and electromechanical elements.

7. The test apparatus according to claim 1, wherein:
said performance board is a circuit board having a first group of contacts in a first predefined configuration for making contact with evaluation and control electronics; and
said performance board has a second group of contacts in a second predefined configuration for making contact with said probe card.

8. The test apparatus according to claim 7, wherein said probe card has contacts for making contact with said second group of said contacts that are on said performance board.

9. The test apparatus according claim 1, wherein said probe card includes distance sensors capable of determining a distance to the wafer at various points.

10. The test apparatus according to claim 1, wherein said probe card has a device for storing and outputting an identification number.

11. The test apparatus according to claim 1, wherein said probe card has test circuits for applying coordinated signals to the wafer, the signals are selected from the group consisting of test signals and test signal sequences.

12. The test apparatus according to claim 1, wherein:
said probe card includes distance sensors for outputting signals indicating distances between said sensors and the wafer; and
said probe card includes a control device for evaluating the signals that are output by said distance sensors, said control device also for driving said actuators.

13. The test apparatus according to claim 1, wherein said probe card includes a component that is selected from the group consisting of a wafer and parts of a wafer.

14. The test apparatus according to claim 13, wherein said contacts of said probe card are a constituent part of said component.

15. The test apparatus according to claim 13, comprising a second wafer that is configured between said probe card and said performance board, said actuators are configured on said second wafer.

16. The test apparatus according to claim 1, wherein the at least three actuators includes a first set of global actuators to compensate for global tilting of the wafer or the chuck and a second set of dedicated actuators, one dedicated actuator for each of the contacts on the probe card, to individually move the associated contact relative to the probe card, wherein the dedicated actuators are configured on the probe card for aligning the contacts of the probe card parallel with the contact areas of the integrated circuit before the contacts of the probe card contact the contact areas on the integrated circuit.

17. A method of testing semiconductor circuits in a test apparatus, which comprises:

providing a wafer that has at least one semiconductor integrated circuit with a group of contact areas that define a wafer surface profile;

providing a test apparatus that includes a chuck for holding the wafer;

providing the test apparatus with a test head that is configured opposite the chuck and that includes a performance board;

providing the test apparatus with a probe card that is configured on the test head and that has contacts for making contact with the contact areas of the integrated circuit;

providing the contacts on the probe card with areas that are intended to come into contact with the contact areas of the integrated circuit and that define a test surface profile;

providing the probe card with at least three actuators to change actuator length according to an electrical signal from the sensors;

using the at least three actuators to align the test surface profile parallel with the wafer surface profile prior to the test surface profiles contacting the wafer surface profile; and using the at least three actuators to enlarge a distance between the performance board and the contacts in a direction substantially orthogonal to the wafer surface profile until the contacts of the probe card have produced an electrical connection with the contact areas of the wafer.

18. The method according to claim 17, which comprises performing the step of using the actuators to enlarge the distance between the performance board and the contacts until a moment selected from, the group consisting of when the contacts have scratched into surfaces of the contact areas and when the contacts have penetrated an oxide layer.

19. The method according to claim 17, which comprises before performing the alignment step, moving the chuck and the wafer toward the probe card such that there is a predefined distance between the wafer and probe card.

20. The method according to claim 17, which comprises permanently registering a distance between the probe card and the wafer.

21. The method according to claim 17, which comprises performing the alignment step by tilting the probe card in relation to the wafer.

22. The method according to claim 17, which comprises performing the alignment step by bending the probe card to form a required surface profile.

23. The method according to claim 17, which comprises performing the alignment step by setting a common distance between the contacts and the contact areas that are to be contacted.

24. The method according to claim 23, which comprises:

performing the step of providing the probe card with actuators by providing an actuator for each one of the contacts; and setting the common distance by using the actuators to change positions of individual ones of the contacts.

25. The method according to claim 17, which comprises performing the step of using the actuators to enlarge the distance between the performance board and the contacts by extending all of the actuators uniformly.

26. The method according to claim 17, which comprises vibrating or oscillating the contacts, at least during the step of enlarging the distance between the performance board and the contacts.

* * * * *